United States Patent [19]
Allen et al.

[11] Patent Number: 5,701,645
[45] Date of Patent: Dec. 30, 1997

[54] ACOUSTIC WAVE DEVICE MANUFACTURING METHOD

[75] Inventors: Donald Eugene Allen, Gilbert; Steven Ray Stringer, Mesa; Richard Dale Coyne, deceased, late of Gilbert, all of Ariz., by Jeannette Coyne, executrix

[73] Assignee: Motorola, Inc., Schaumburg, Ill.

[21] Appl. No.: 460,772

[22] Filed: Jun. 2, 1995

Related U.S. Application Data

[62] Division of Ser. No. 223,878, Apr. 6, 1994, abandoned.

[51] Int. Cl.$^6$ .............................. H03H 3/08; G01R 31/00
[52] U.S. Cl. ................... 29/25.35; 29/593; 29/600; 324/525; 324/716; 324/718; 310/313 B; 333/193
[58] Field of Search .......................... 29/25.35, 593, 29/600, 846; 324/525, 527, 716, 718, 765; 310/313 B; 428/209, 210, 688, 901; 353/193, 194

[56] References Cited

U.S. PATENT DOCUMENTS

| | | | |
|---|---|---|---|
| 4,314,393 | 2/1982 | Wakatsuki et al. | 29/593 X |
| 4,364,016 | 12/1982 | Tanski | 333/193 |
| 4,448,805 | 5/1984 | Lewis | 427/100 |
| 4,516,071 | 5/1985 | Buehler | 324/158 R |
| 4,628,222 | 12/1986 | Lewis | 310/313 R |
| 4,890,369 | 1/1990 | Tanski | 29/25.35 |
| 5,039,126 | 8/1991 | Allen | 333/193 |
| 5,162,689 | 11/1992 | Fliegel et al. | 310/313 B |
| 5,243,249 | 9/1993 | Miyashita et al. | 310/313 B |

Primary Examiner—S. Thomas Hughes
Attorney, Agent, or Firm—Frederick M. Fliegel

[57] ABSTRACT

A method for making an acoustic wave device. The method has steps of providing a substrate suitable for acoustic wave devices and processing the substrate to provide a patterned metallization thereon. The patterned metallization includes an acoustic wave filter pattern. The method also has steps of measuring a sheet resistance associated with the acoustic wave filter pattern, determining a resistance of a test pattern associated with the acoustic wave filter pattern to provide a measured resistance and computing an estimated average linewidth for the acoustic wave filter pattern from the measured resistance and the sheet resistance.

18 Claims, 2 Drawing Sheets

ACOUSTIC WAVE DEVICE MANUFACTURING METHOD

This is a division of application Ser. No. 08/223,878, filed Apr. 6, 1994, now abandoned.

FIELD OF THE INVENTION

This invention relates in general to the field of microelectronic components, in particular to microelectronic frequency selection components and more particularly to monolithic acoustic wave filter devices.

BACKGROUND OF THE INVENTION

Microminiaturized filters are important for many compact electronic communication products requiring high performance in a robust, lightweight and small sized form, e.g., hand-held or smaller telephones, data links for computers, paging apparatus and the like. These needs are often met via surface acoustic wave ("SAW") structures such as filters, resonators etc. employing interdigitated strips of metal ("fingers") arranged in a periodic or quasi-periodic fashion along a preferred axis of a piezoelectric material and on a suitably-prepared (i.e., polished, planar) surface thereof. The devices are typically produced en masse on "wafers" of piezoelectric material via techniques similar to those employed to manufacture integrated circuits. These are often "probed" while still in wafer form by placing the wafer on a vacuum chuck and bringing electrical contacts known as "pads" or "bond pads" on each die into contact with a group of needles configured to match the bond pads of the die and then making low-frequency (or "DC") measurements to determine which die are defective, e.g., include short circuits. These defective die are marked (e.g., with a drop of ink or by scratching) and/or their location on the wafer may be stored in an electronic memory. The wafer is then typically "diced" or sawn into individual die and defective dice are automatically discarded. The remaining dice are then individually placed into packages, electrically connected to pins or other interconnections on the packages and the packages are then hermetically sealed. The expenses associated with packaging dice are avoided for those die determined to be defective at the wafer level.

The width of the transducer fingers is critical for determining the operating frequency of the finished component or filter. This is especially true for filters employing more strongly piezoelectric (higher coupling coefficient) materials. For example, in some filters designed to operate in the 800 MHz and higher frequency range, measured filter response shifts 1.7 MHz in frequency for every 0.1 millionths of a meter change in finger width, also known as "linewidth". In this frequency range, it is difficult and impractical to measure the radio frequency characteristics of the acoustic wave device without first separating the individual die one from another and packaging them. Packaging the devices is a significant portion of the cost of the completed component. When the linewidth of the transducer deviates from that desired by a sufficient amount, the completed filter fails to provide the required frequency characteristics and is scrapped.

What is needed is a method and the related apparatus for estimating the as-fabricated linewidth from economical electrical measurements performed at the wafer level.

Some acoustic wave filters employ a plurality of acoustic wave transducers microfabricated on a common substrate and interconnected in a series or series-parallel (e.g., ladder, lattice etc.) fashion such that individual bond pads are not available for each transducer and further such that at least some of the transducers are not accessible for low frequency testing. Again, fatal defects such as shorted transducers cannot be readily identified without incurring the added expenses associated with first packaging the dice and then individually testing the finished filters. An additional problem is that the piezoelectric materials employed as substrata for some types of acoustic devices are also strongly pyroelectric and the temperature changes induced during microfabrication of the die result in electrical discharges which damage or destroy individual die and occasionally fracture the entire wafer.

It is known that including a grid or mesh of electrically interconnected metallic features can ameliorate this problem as described in U.S. Pat. No. 4,628,222, issued to Lewis and entitled "Protection Of SAW Devices Comprising Metallized Regions On Dielectric Substrates" and also in U.S. Pat. No. 5,243,249, issued to Miyashita et al. and entitled "SAW Device Having A Plurality Of Electrodes", which patents are hereby incorporated herein by reference. However, this does not address difficulties encountered in wafer level, low frequency characterization of acoustic wave devices.

What is needed is a method and the related apparatus for automatically determining which dice include electrically short-circuited transducers at the wafer level via low frequency electrical measurements and which mitigates pyroelectric damage to the devices during fabrication.

SUMMARY OF THE INVENTION

Accordingly, there are provided a new and improved acoustic wave device and a method for making the acoustic wave device. The method has steps of providing a substrate suitable for acoustic wave devices and processing the substrate to provide a patterned metallization thereon. The patterned metallization includes an acoustic wave filter pattern. The method also has steps of measuring a sheet resistance associated with the acoustic wave filter pattern, determining a resistance of a test pattern associated with the acoustic wave filter pattern to provide a measured resistance and computing an estimated average linewidth for the acoustic wave filter pattern from the measured resistance and the sheet resistance.

In a preferred embodiment the acoustic wave device comprises an associated Van der Pauw cross including first, second, third and fourth arms coupled to a common element comprising a square. The first, second, third and fourth arms are coupled to first, second, third and fourth sides of the square, respectively. The method includes steps of sourcing a first current $I_1$ having a first known magnitude into the first arm and sinking the first current $I_1$ out of the second arm. The second arm is adjacent the first arm. The method also includes steps of measuring a voltage $V_1$ between the third and fourth arms and computing an estimated average sheet resistance $R_{SH}$ for the associated acoustic wave filter pattern according to $R_{SH} = (V_1/I_1)(\pi/\ln(2))$. Furthermore, the method includes the calculation of the linewidth of a known length of line $\xi$ according to $L_w = (\xi \cdot R_{SH})/(V_2/I_2)$, where $V_2$ represents the voltage drop across the known line length $\xi$ when current $I_2$ is forced through the line. Linewidth $L_w$ is desirably chosen to have a known relationship to the finger widths in the transducer(s) (e.g., an integral or nonintegral multiple thereof, i.e., 1.5x, 2x etc.) and is preferably nominally the same as the finger widths.

The method desirably but not essentially includes a step of culling dice for which the linewidth computed in the computing an estimated average sheet resistance or linewidth steps falls outside a predetermined range of acceptable values.

The present invention further provides an acoustic wave device and a method for making the acoustic wave device. The method includes steps of providing a substrate suitable for acoustic wave devices and processing the substrate to provide a patterned metallization thereon. The patterned metallization includes a plurality of die each including an acoustic wave filter pattern. The acoustic wave filter pattern includes a plurality of N many interdigital acoustic wave transducers and a plurality of M many resistor patterns, wherein $M \leq N$. The method also includes steps of measuring a resistance across a selected transducer pattern within the die and comparing the resistance thus measured to a table of predetermined resistance values. Selected values of resistance correspond to specific defects in the patterned metallization. The method further includes a step of identifying defective die on the substrate from the comparing step.

The method desirably but not essentially includes a step of culling defective die identified in the identifying step.

The method further desirably but not essentially includes a substep of processing the substrate to provide M many resistor patterns, the M many resistor patterns disposed in such a fashion that all of the N many transducer patterns are provided with a DC connection from one bus bar to another bus bar of the transducer patterns.

BRIEF DESCRIPTION OF THE DRAWINGS

The invention is pointed out with particularity in the appended claims. However, a more complete understanding of the present invention may be derived by referring to the detailed description and claims when considered in connection with the figures, wherein like reference characters refer to similar items throughout the figures, and:

The exemplification set out herein illustrates a preferred embodiment of the invention in one form thereof, and such exemplification is not intended to be construed as limiting in any manner.

DETAILED DESCRIPTION OF THE DRAWINGS

The terms "short" and "short circuit" are used interchangeably herein to mean electrical short circuits or low resistances between elements desirably having high electrical resistance therebetween. The terms "acoustic wave filter" and "SAW filter" are used interchangeably herein to mean frequency selection components employing acoustic waves in solids. The terms "die", "SAW die" and "acoustic wave filter die" are used interchangeably herein to mean individual filter components after separation from a common wafer. The terms "electrode" and "finger" are used interchangeably herein to mean interdigitated electrodes employed for launching/receiving acoustic waves.

Figure 1:
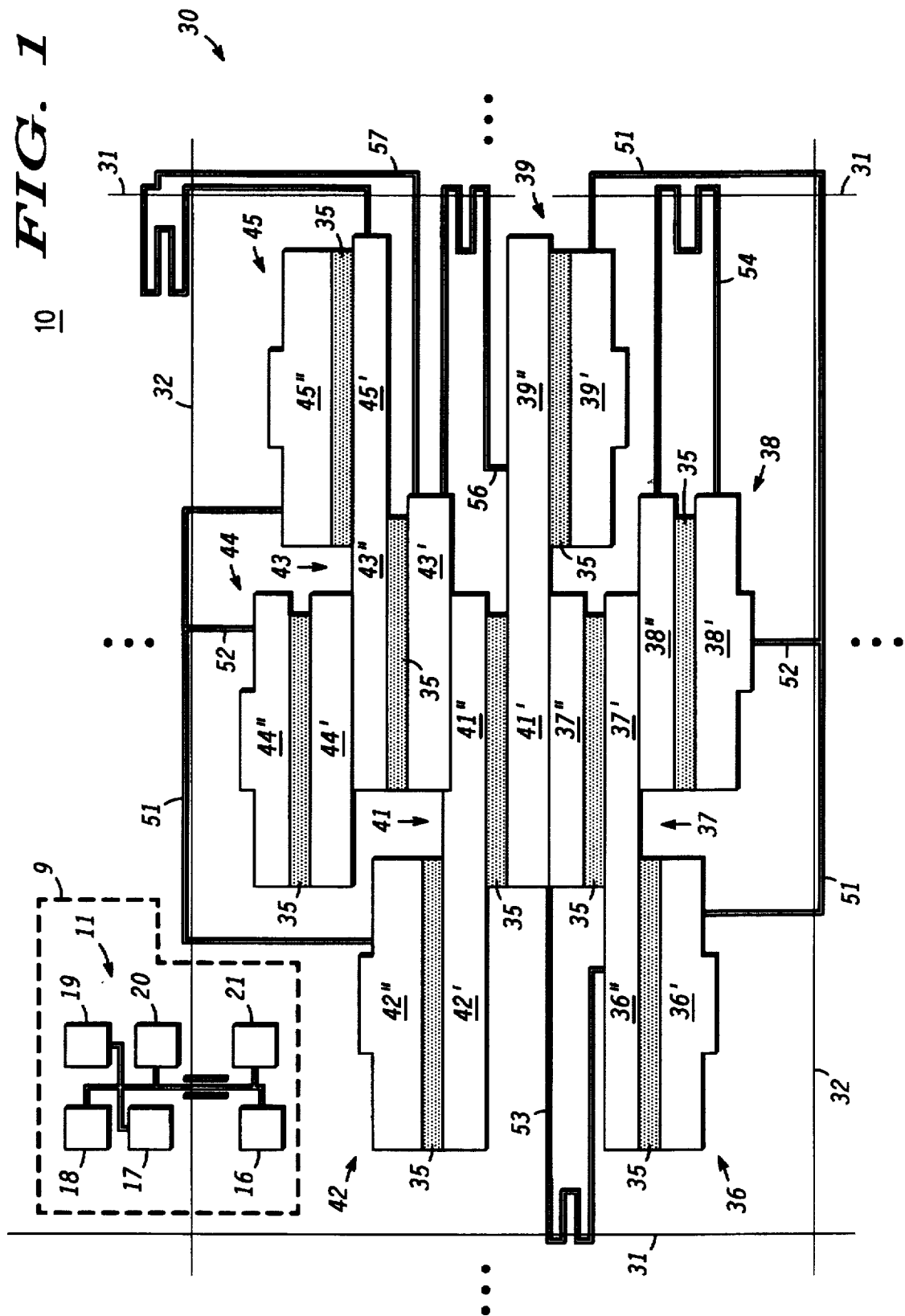
FIG. 1 is a simplified plan view of an acoustic wave filter die according to the present invention.

FIG. 1 is a simplified plan view of acoustic wave filter die 10, including acoustic wave filter 30, according to the present invention. The present invention is useful in the context of acoustic wave filters such as that described in U.S. patent application Ser. No. 07/793,925, filed on Nov. 18, 1991, now U.S. Pat. No. 5,309,126, which is assigned to the same assignee as the instant invention and which is hereby incorporated herein by reference. Acoustic wave filter 30 comprises one or more acoustic wave transducer (hereinafter "transducer") patterns, e.g., 36, 37, 38, 39, 41, 42, 43, 44, contained within scribe lines 31, 32. Scribe lines 31, 32 may define a rectilinear grid, as indicated by ellipses, or may define a rhombic grid (not illustrated) wherein scribe lines 31 meet scribe lines 32 at angles other than 90°.

Transducers 36–45 each include bus bars, denoted by the same numerical reference characters as the transducers, but including the designation prime or double prime for the lower (K') and upper (K") bus bars, respectively, where K represents any of reference characters 36–45. Space 35 between bus bars K', K" is generally filled with fine interdigitated electrodes such that bus bars K', K" and electrodes 35 form a capacitor.

In the example provided in FIG. 1, transducers 36–45 are interconnected to provide a ladder filter configuration, however, other arrangements including single port resonators, coupled resonators, coupled resonator filters, conventional SAW filters and delay lines, etc. may also benefit from inclusion of the features of the present invention. Die 10 is typically photolithographically defined on a suitably prepared surface of a piezoelectric substrate (e.g., $LiNbO_3$, $LiTaO_3$ etc.) which often exhibit pyroelectric effects. The present invention is especially useful in the context of substrates offering leaky surface waves having large (e.g.,>5%, for example, 36° $LiTaO_3$, 41° $LiNbO_3$, 64° $LiNbO_3$) coupling coefficients.

Pyroelectric effects may result in damage to SAW devices in the course of normal microlithography operations. Following photolithographic definition of SAW dice 10, individual die 10 are prepared by separation (i.e., dicing, typically by sawing) along scribe lines 31, 32. Individual die 10 are then packaged and tested, including electrical tests, prior to shipping and/or incorporation into electronic assemblies such as radios.

Also shown in FIG. 1 are interconnective features 51, 52, 53, 54, 56, 57, allowing ready determination of short circuits within any of SAW transducers 36–45 as well as providing indicia as to which of transducers 36–45 may be faulty. Applicants have discovered that interconnective features 51–57 not only afford protection against pyroelectric and/or electrostatic discharge damage while die 10 are in wafer form but also provide information as to which of transducers 36–45 include short circuits comprising fatal defects from two-point DC probing (e.g., a resistance measurement performed between busses 45', 45", also known as "pads"). Determining which die 10 include fatal defects prior to packaging allows culling of defective die 10.

Determining which specific one or a subset of transducers 36–45 is defective is possible with a single DC measurement when resistances of interconnective features 51–57 are chosen to differ such that the individual features 51–57 provide distinct values, distinct pairwise sums of resistances and distinct three-way sums for all possible combinations of interconnective features when these features form four separate resistors. More generally, $R_i \neq R_j + R_k \neq R_1 + R_m + R_n$ etc. where i, j, k, l, m, n are integers less than or equal to the total number of interconnective elements (having resistances R) included and the sums continue to M−1 (=3 in this example) when M (=4, this example) many elements are included (i.e., i through $n \leq 4$). Another general statement of the rule is that sums over arbitrary numbers of resistances (corresponding to interconnective elements) do not produce the same sum resistance values unless the sums correspond to the same set of elements. When measurements are made between several sets of bus bars K', K", defects may be mapped less ambiguously.

Resistances R1–R4 are desirably (i) significantly greater in value than a typical value for a short between transducer fingers, (ii) measurably distinct from one another and from sums of one another's values, (iii) low enough in value to provide protection against electrostatic discharge and/or pyroelectric phenomena and (iv) insignificant in effect provided on completed SAW filter radio frequency operation.

Typically, shorts between transducer fingers in spaces 35 include a square or less comprising the actual short and several squares including the electrodes in spaces 35. The externally measured resistance of a short (i.e., between bond pads K', K") is related to the acoustic aperture employed. When the same metallization thickness is employed for the transducer features and for the interconnective features, ensuring that an interconnective feature includes an order of magnitude more squares than an electrode across the acoustic aperture guarantees that condition (i) above is met. Condition (iii) is readily met at virtually any metallization thickness. Condition (iv) may be met in any of several ways. When interconnective features comprise a number of electrical wavelengths of RC transmission line at the frequencies of interest, a relatively high effective impedance (e.g., 200 $\Omega$) is readily provided and quarter-wavelength techniques may be additionally employed to provide high RF impedances together with very low DC resistances. In the instant example, interconnective elements 51–57 extend into scribe lines 31, 32 a sufficient distance that interconnective elements 51–57 are severed when die 10 are diced, raising the associated resistance values to suitable values.

FIG. 1 also illustrates Van der Pauw cross pattern 11 and simulated electrode pattern 12, which together comprise test pattern 9. Patterns 11, 12 in cooperation provide effective average linewidth estimates made from DC measurements.

Figure 2:
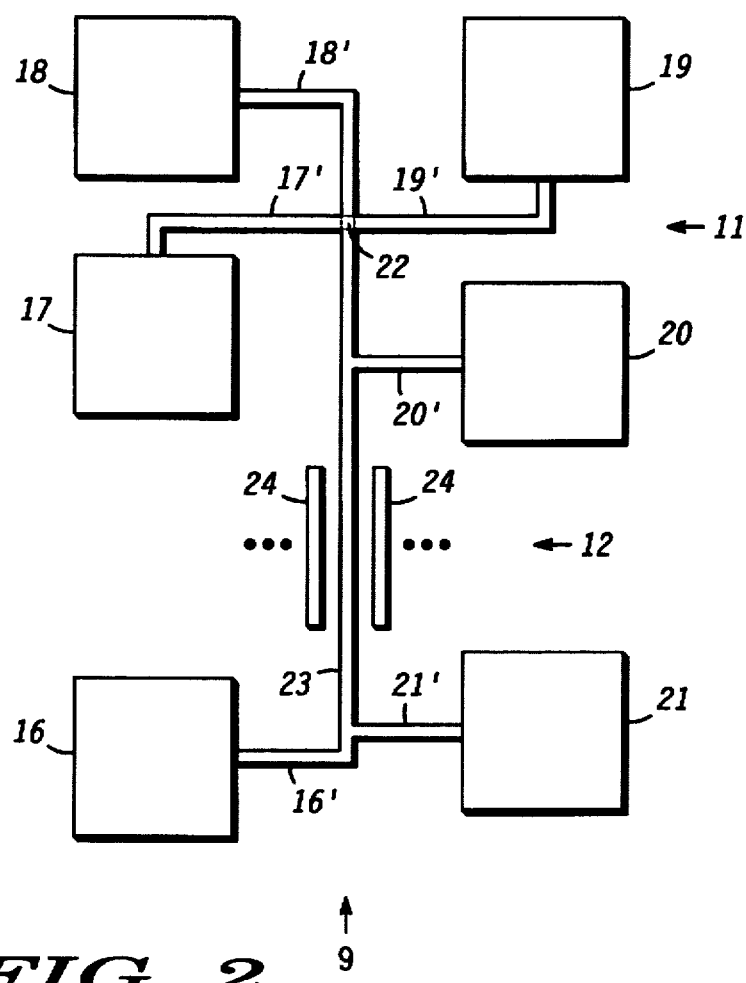
FIG. 2 is a more detailed and enlarged view of a portion of the pattern illustrated in FIG. 1, illustrating a Van der Pauw pattern.

Referring now to FIGS. 1 and 2, Van der Pauw cross pattern 11 allows measurement of the sheet resistance of the metallization employed while simulated electrode pattern 12 provides an estimate of the linewidth achieved in the transducer finger area 35 when sheet resistance $R_{SH}$ of the metallization is known. Van der Pauw cross pattern 11 comprises pads 17–20 interconnected via interconnections 17'–20' to metallized region 22 ("square 22") having a known number of squares therein and usefully comprising one square. When DC current $I_1$ is forced through square 22 from any one pad 17–20 to any adjacent pad 17–20, DC voltage $V_1$ is measurable across the remaining two of pads 17–20. Sheet resistivity $R_{SH}$ in Ohms per square is then:

$$R_{SH}=(V_1/I_1)(\pi/\ln(2)),\quad(1)$$

where ln(2) refers to the natural logarithm (i.e., base e) of two.

Simulated electrode pattern 12 comprises pad 20, a portion of interconnection 20', line 23 having known length $\xi$ and having a linewidth desirably comparable and preferably identical to critical linewidths of transducer electrodes in spaces 35 of transducers 36–45, dummy bars 24 disposed to either side of line 23 and pads 16, 21 together with associated interconnections 16', 21', respectively. Dummy bars 24 are desirably disposed with the same pitch, periodicity and line to space ratio (i.e., have the same linewidth) as transducer electrodes in transducers 36–45 and further are desirably disposed parallel thereto. Dummy bars 24 simulate the optical or exposure conditions as well as the etching etc. conditions relevant to the electrodes within spaces 35 transducers 36–45 and thus line 23 has linewidth $L_W$ substantially similar to that of the transducer electrodes found in spaces 35 of transducers 36–45.

For line 23 of length $\xi$ (i.e., between pads 20, 21), linewidth $L_W$ is then:

$$L_W=(R_{SH}\xi)/(V_2/I_2),\quad(2)$$

where $V_2$ is measured between pads 20, 21 in response to current $I_2$ forced therebetween. Current $I_2$ is usefully provided via pads 18, 16 and is conveniently chosen to be equal to current $I_1$. By this arrangement, DC characterization allows ready estimation of linewidth $L_W$. Applicants have discovered that linewidth $L_W$ statistically correlates well with linewidths obtained in spaces 35 of transducers 36–45 and so provides a signature predictive of RF characteristics thereof, in particular, center frequency characteristics. For example, in some applications a value that is more than 1% different from the nominal will provide transducers having unacceptable frequency characteristics. For other applications, values that are, for example, 2%, 3%, 4% or 5% different from a predetermined nominal value may not be acceptable. For an 800 MHz filter fabricated on 64° lithium niobate, a 5% linewidth deviation corresponds to about a 0.8 MHz frequency shift. Thus, a simple, effective technique for estimating center frequency characteristics of transducers 36–45 is provided that is readily implemented at the wafer stage of processing prior to dicing and packaging of individual die 10. This technique is useful for filters comprising as few as one transducer or as many as 13 or more.

For example, considering a three (=N) transducer "T" configuration including one resistor configured as in FIG. 1, only a measured resistance value of R1 indicates all transducers are functional. A measured resistance value corresponding to a short circuit indicates one of seven ($=2^N-1$) different defect patterns. Alternatively, a ladder configuration with N=5 (=# of transducers) and M =2 (=# of resistors), only measured resistance values of R1+R2 or R2 are indicative of the exact number and location of faulty (shorted) transducers (zero and T3, respectively). There are $2^N-2=30$ ambiguous results for a single two-point measurement.

For any given filter and transducer metallization pattern, except N=1, there may be several workable resistor and measurement combinations. In the simplest case of a two transducer filter, the transducers can be shunted with individual resistors and two measurements may be employed. Adding a third resistor between the two transducers allows a single measurement to completely map shorts in the filter. Generally, 2N combinations of open/shorted transducers are possible with $2^N-M$ of the measured values being ambiguous as to the location of the short circuit(s) when a single two point measurement is employed and fewer ambiguities when the number of two point measurements is increased.

Figure 3:
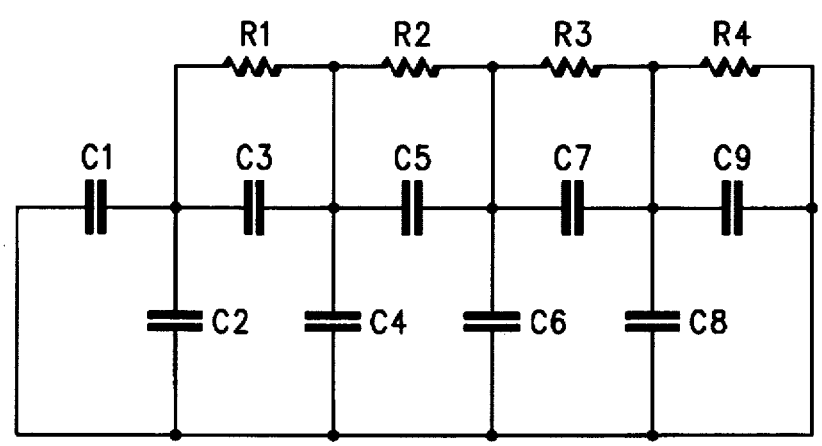
FIG. 3 is a simplified schematic diagram of a portion of the acoustic wave filter of FIG. 1.

FIG. 3 is a simplified schematic diagram of portion 70 of the acoustic wave filter of FIG. 1, showing resistors R1–R4 coupled together in series, and C1–C9, corresponding to transducers 45–36 of FIG. 1, respectively. For example, R1 of FIG. 2 may correspond to interconnection element 57 of FIG. 1 and similarly R2 to element 56, R3 to element 53, R4 to element 54, with transducers 44, 45, 43, 42, 41, 39, 37, 36, 38 corresponding to capacitors C1–C9, respectively, and where interconnection elements 51, 52 desirably provide low resistance interconnections (i.e., preferably having less than one-fifth to one-tenth or less of the resistance of any of R1–R4).

In one embodiment, resistance values of R1=50 $\Omega$, R2=65 $\Omega$, R3=135 $\Omega$ and R4=220 $\Omega$ provide (i) good distinction of short circuits (where a shorted transducer has a resistance of circa 8 $\Omega$ measured between bus bars K', K", (ii) provide clear identification of shorts of resistor(s) R1–R4, (iii) are readily measurable and (iv) fulfill the anti-fracture properties desired in device fabrication. Values for R1–R4 in the same ratios (i.e., R1/R2, R2/R3 etc.) in a range where R1 (or the lowest valued resistor) falls within 24 Ω to 120 Ω would also work. Values having different ratios but that are consistent with the "different sum" rules discussed herein (see supra) are also useful in the present invention.

The techniques demonstrated with respect to the patterns of FIGS. 1 through 3 allow simple, wafer-scale DC probing techniques to (i) identify shorted die 10 prior to dicing and packaging, (ii) determine systematic trends in shorted die 10, facilitating diagnosis and correction of any problems at an early stage, (iii) identify characteristic signatures correlated to unacceptable RF performance prior to dicing and packaging, (iv) ameliorate pryoelectric and electrostatic discharge problems associated with reduced yields and (v) provide in situ process control.

In one implementation, DC interconnections between pattern elements (i.e., transducers 36–45) are severed by the dicing operation, conveniently providing die 10 suitable for RF applications. Defects fatal to device performance are rapidly identified, facilitating correction of conditions causal thereto and also permitting culling of defective die 10 early in the production cycle. These useful goals are accomplished without requiring any additional processing steps, materials or equipment beyond that normally involved in production of acoustic wave filters.

Thus, techniques and apparatus have been described which overcome specific problems and accomplish certain advantages relative to prior art methods and mechanisms. The improvements over known technology are significant. The complexities and high manufacturing liabilities of traditional practices are avoided. Similarly, corrective data are rapidly gleaned early in the production cycle, facilitating corrective action. These advantages are realized without requiring additional processing steps, added materials or extra equipment.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

It is claimed:

1. A method for making an acoustic wave device, said method comprising steps of:
   (a) providing a substrate suitable for acoustic wave devices;
   (b) processing said substrate to provide a patterned metallization thereon, said patterned metallization including an acoustic wave filter pattern;
   (c) measuring a sheet resistance associated with the acoustic wave filter pattern;
   (d) determining a resistance of a first test pattern associated with said acoustic wave filter pattern to provide a measured resistance;
   (e) computing an estimated average linewidth for said acoustic wave filter pattern from said measured resistance and said sheet resistance; and
   (f) culling die for which the linewidth computed in said step (e) falls outside of a predetermined range of acceptable values.

2. A method as claimed in claim 1, wherein said step (b) includes substeps of:
   processing said substrate to provide a second test structure including a bridge structure having first, second, third and fourth terminals, wherein said bridge structure comprises a first line having a first linewidth comparable to a linewidth of said acoustic wave device and wherein said first line is spaced apart from a second line having said first linewidth and disposed to a first side of said first line by a distance comparable to that separating said electrodes in said acoustic wave device and wherein said first line is spaced apart from a third line having said first linewidth and disposed to a second side of said first line by said distance, wherein said second and third lines extend along a length of said first line between said second and third terminals; and said step (d) includes substeps of:
   (i) sourcing a current of known magnitude into said first terminal;
   (ii) sinking said current from said fourth terminal;
   (iii) measuring a voltage between said second terminal and said third terminal to provide a measured voltage; and
   (iv) computing a resistance for a portion of said bridge structure between said second and third terminals by dividing said measured voltage by said known magnitude.

3. A method for identifying which transducers are defective in a die for an acoustic wave device and for preventing pyroelectric fracture, said method comprising steps of:
   (a) providing a substrate suitable for acoustic wave devices;
   (b) processing said substrate to provide a patterned metallization thereon, said patterned metallization comprising a plurality of die each including an acoustic wave filter pattern, each said acoustic wave filter pattern comprising a plurality of N many interdigital acoustic wave transducers and a plurality of M many resistor patterns, wherein $M \leq N$, and further wherein each of said M many resistor patterns includes a resistance greater by at least an order of magnitude than an end-to-end resistance of an electrode of any of said N many interdigital acoustic wave transducers;
   (c) measuring a resistance across a selected transducer pattern within each die of said plurality of die;
   (d) comparing the resistance thus measured to a table of predetermined resistance values, wherein selected values of resistance correspond to specific defects in the patterned metallization; and
   (e) identifying defective die on said substrate from said comparing step.

4. A method as claimed in claim 3, further including a step (f) of culling defective die identified in said identifying step.

5. A method as claimed in claim 3, wherein said step (b) includes a substep (i) of processing said substrate to provide said M many resistor patterns, said M many resistor patterns disposed in such a fashion that all of said N many transducer patterns are provided with a DC connection from one bus bar to another bus bar of said transducer patterns.

6. A method as claimed in claim 3, further including a step (f) of separating said die from each other and severing each of said M many resistor patterns when said die are separated from each other.

7. A method as claimed in claim 3, wherein said step (b) includes a substep (i) of processing said substrate to provide said M many resistor patterns, each of said M many resistor patterns corresponding to one of M many unique resistor values.

8. A method as claimed in claim 3, wherein said step (b) includes a substep (i) of processing said substrate to provide said M many unique resistor values, wherein each of said M many unique resistor values is chosen to be different from each other of said M many unique resistor values.

9. A method as claimed in claim 3, wherein said step (b) includes a substep (i) of processing said substrate to provide said M many unique resistor values each of said M many unique values chosen to be different from the sum of any two other of said M many unique resistor values.

10. A method as claimed in claim 3, wherein said step (b) includes a substep (i) of processing said substrate to provide said M many unique resistor values, each of said M many unique resistor values chosen to be different from a sum of M−1 many other unique resistance values.

11. A method as claimed in claim 3, further including a step (f) of culling defective die identified in said identifying step.

12. A method as claimed in claim 11, further including a step (g) of separating said die from each other and severing each of said M many resistor patterns when said die are separated from each other.

13. A method for identifying which transducers are defective in a die for an acoustic wave device and for preventing pyroelectric fracture, said method comprising steps of:

(a) providing a substrate suitable for acoustic wave devices;

(b) processing said substrate to provide a patterned metallization thereon, said patterned metallization comprising a plurality of die each including an acoustic wave filter pattern, each said acoustic wave filter pattern comprising a plurality of N many interdigital acoustic wave transducers and a plurality of M many resistor patterns, wherein M≦N;

(c) measuring a sheet resistance associated with the acoustic wave filter pattern;

(d) determining a resistance of a test pattern associated with said acoustic wave filter pattern to provide a measured resistance;

(e) computing an estimated average linewidth for said acoustic wave filter pattern from said measured resistance and said sheet resistance;

(f) comparing the estimated average linewidth thus measured to a table of predetermined linewidth values, wherein selected values of linewidth correspond to acceptable linewidths;

(g) identifying defective die on said substrate from said step (f);

(h) measuring a resistance across a selected transducer pattern within each die of said plurality of die;

(i) comparing the resistance thus measured to a table of predetermined resistance values, wherein selected values of resistance correspond to specific defects in the patterned metallization; and (j) identifying defective die on said substrate from said step (i).

14. A method for identifying which transducers are defective in a die for an acoustic wave device and for preventing pyroelectric fracture, said method comprising steps of:

(a) providing a substrate suitable for acoustic wave devices;

(b) processing said substrate to provide a patterned metallization thereon, said patterned metallization comprising a plurality of die each including an acoustic wave filter pattern, each said acoustic wave filter pattern comprising a plurality of N many interdigital acoustic wave transducers and a plurality of M many resistor patterns, wherein M≦N, and further wherein each of said M many resistor patterns includes a resistance greater by at least an order of magnitude than an end-to-end resistance of an electrode of any of said N many interdigital acoustic wave transducers, said M many resistor patterns disposed in such a fashion that all of said N many transducer patterns are provided with a DC connection from one bus bar to another bus bar of said transducer patterns;

(c) measuring a resistance across a selected transducer pattern within each die of said plurality of die;

(d) comparing the resistance thus measured to a table of predetermined resistance values, wherein selected values of resistance correspond to specific defects in the patterned metallization; and (e) identifying defective die on said substrate from said comparing step.

15. A method as claimed in claim 14, wherein said step (b) includes a substep (i) of processing said substrate to provide said M many resistor patterns, each of said M many resistor patterns corresponding to one of M many unique resistor values.

16. A method as claimed in claim 15, wherein said step (b) includes a substep (ii) of processing said substrate to provide said M many unique resistor values, wherein each of said M many unique resistor values is chosen to be different from each other of said M many unique resistor values.

17. A method as claimed in claim 16, wherein said step (b) includes a substep (iii) of processing said substrate to provide said M many unique resistor values, each of said M many unique values chosen to be different from the sum of any two other of said M many unique resistor values.

18. A method as claimed in claim 17, wherein said step (b) includes a substep (iv) of processing said substrate to provide said M many unique resistor values, each of said M many unique resistor values chosen to be different from a sum of M−1 many other unique resistance values.

* * * * *